United States Patent
Kwak et al.

(10) Patent No.: US 6,551,848 B2
(45) Date of Patent: Apr. 22, 2003

(54) METHOD FOR FABRICATING SEMICONDUCTOR LIGHT EMITTING DEVICE

(75) Inventors: Joon-seop Kwak, Kyungki-do (KR); Kyo-yeol Lee, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 10/096,919

(22) Filed: Mar. 14, 2002

(65) Prior Publication Data

US 2002/0177247 A1 Nov. 28, 2002

(30) Foreign Application Priority Data

May 26, 2001 (KR) .......................... 2001-29253

(51) Int. Cl.[7] .............................. H01L 21/00
(52) U.S. Cl. ............................ 438/22; 438/40
(58) Field of Search ...................... 438/22, 29, 31, 438/46, 47, 48, 93, 28, 40, 67, 94

(56) References Cited

U.S. PATENT DOCUMENTS 4,876,569 A * 10/1989 Nishitoku
5,439,843 A * 8/1995 Sakaguchi et al.
5,744,857 A * 4/1998 Yamamoto
5,956,362 A * 9/1999 Yokogawa et al.
6,342,405 B1 * 1/2002 Major et al.
6,380,551 B2 * 4/2002 Abe et al.

* cited by examiner

*Primary Examiner*—David Nelms
*Assistant Examiner*—Phuc T. Dang
(74) *Attorney, Agent, or Firm*—Burns Doane Swecker & Mathis, LLP

(57) ABSTRACT

A method for fabricating a semiconductor light emitting device is provided. The method involves: forming a light emitting construct including a p-type electrode on a n-type substrate; etching a bottom surface of the n-type substrate; and forming an n-type electrode on the etched bottom surface of the n-type substrate. The bottom surface of the n-type substrate is wet or dry etched. The bottom surface of the n-type substrate is free from damage so that stable attachment of the etched bottom surface of the n-type substrate is ensured with improved properties of the light emitting device which may be a semicoductor laser diode.

16 Claims, 8 Drawing Sheets

METHOD FOR FABRICATING SEMICONDUCTOR LIGHT EMITTING DEVICE

Priority is claimed to Patent Application number 2001-29253 filed in Rep. of Korea on May 26, 2001, herein incorporated by reference.

BACKGROUND OF THE INVENTION

1. Field of the Invention

The present invention relates to a method for fabricating a semiconductor light emitting device, and more particularly, to a method for fabricating a semiconductor light emitting device by which an n-type electrode can be effective formed by processing the bottom of a substrate.

2. Description of the Related Art

The need for high-density information recording has increased the demand for semiconductor visible-light emitting devices. In particular, the market release of high-density optical recording media such as digital versatile discs (DVDs) has boosted the need for visible-light emitting laser diodes. There are available a variety of compound semiconductor laser diodes (LDs) capable of visible laser emission. In particular, III–V nitride compound semiconductor laser diodes, a direct transition type that ensures high-efficiency laser oscillation, have received considerable attention because of the ability to emit blue laser light. Semiconductor-based blue light emitting diodes (LEDs) also are attractive because they can be applied to lightening devices.

In general, III–V nitride compound semiconductor light emitting devices are formed on gallium nitride (GaN) substrates to improve their light emitting characteristics.

FIG. 1 is a sectional view of a conventional GaN-based LED formed on a GaN substrate. Referring to FIG. 1, an n-doped GaN layer 4, an active layer 6, and a p-doped GaN layer 8 are sequentially formed on a GaN substrate 2. A transparent p-type electrode 10 is formed on the p-doped GaN layer 8, and a bonding pad 12 is formed in a predetermined region of the p-type electrode 10.

In FIG. 1, reference numeral 14 denotes an n-type electrode formed on the bottom of the GaN substrate 2. The n-type electrode 14 is attached to the bottom of the GaN substrate 2 after grinding, lapping, or polishing the bottom of the GaN substrate 2 to a thickness by which a resulting light emitting device can still be supported. During this polishing step, the bottom of the GaN substrate 2 is damaged, thereby resulting in a damaged layer 16 on the bottom of the GaN substrate 2. As a result, the n-type electrode 14 is attached to the damaged layer 16.

Accordingly, the properties of the resulting light emitting device degrade due to poor attachment of the n-type electrode 14 to the GaN substrate 2. For example, a relative light emitting efficiency with respect to the voltage applied to the n-type electrode 14 may be lowered. Also, the light emission during operation of the light emitting device becomes poor, thereby shortening the lifespan.

FIG. 2 is a sectional view of a conventional GaN laser diode (LD) formed on a GaN substrate. Referring to FIG. 2, an n-doped GaN layer 24, an n-doped AlGaN/GaN cladding layer 26, an n-doped GaN waveguide layer 28, an InGaN active layer 30, a p-doped GaN waveguide layer 32, a p-doped AlGaN/GaN cladding layer 34, and a p-doped GaN layer 36 are sequentially formed on a GaN substrate 22. The p-doped AlGaN/GaN cladding layer 34 has a ridge to be used as a current path, and the p-doped GaN layer 36 is formed on the ridge. A passivation layer 38 is formed on the p-doped AlGaN/GaN cladding layer 34 having the ridge to expose a current path region of the p-doped GaN layer 36. A p-type electrode 40 is formed on the passivation layer 38 in contact with the exposed region of the p-doped GaN layer 36. An n-type electrode 42 is formed on the bottom of the GaN substrate 22 by the same process as for the n-type electrode 14 of the LED shown in FIG. 1. As a result, a damaged layer 44 is formed on the bottom of the GaN substrate 22 of the LD, and the n-type electrode 42 is formed on the damaged layer 44, thereby causing similar problems as those occurring in the LED.

In general, when forming a III–V nitride-based compound semiconductor light devices on a GaN substrate, the bottom of the substrate is subjected to mechanical polishing to reduce the thickness of the substrate for the purpose of heat dissipation and device isolation for LEDs, and cleaved plane formation for LDs. However, during this polishing process, a damaged layer is formed on the bottom of the substrate, as described above, so that attachment of the n-type electrode to the bottom of the GaN substrate becomes unstable, thereby degrading device properties.

SUMMARY OF THE INVENTION

To solve the above-described problems, it is an object of the present invention to provide a method of fabricating a semiconductor light emitting device by which formation of a damaged layer on the bottom of a substrate on which a light emitting device is formed, in processing the bottom of the substrate is prevented so that device properties are improved.

To achieve the object of the present invention, there is provided a method for fabricating a semiconductor light emitting device, the method comprising: forming a light emitting construct including a p-type electrode on a n-type substrate; etching a bottom surface of the n-type substrate; and forming an n-type electrode on the etched bottom surface of the n-type substrate.

It is preferable that, after forming the light emitting construct and before etching the bottom surface of the n-type substrate, the bottom surface of the n-type substrate is mechanically polished. It is preferable that the light emitting construct is for a light emitting diode (LED) or a laser diode (LD).

It is preferable that the bottom surface of the n-type substrate is dry or wet etched. The dry etching may be accomplished by a method selected from the group consisting of chemical assisted ion beam etching (CAIBE), electron cyclone resonance (ECR) etching, inductively coupled plasma (ICP) etching, and reactive ion etching (RIE). Preferably, the dry etching uses $Cl_2$, $BCl_3$ or HBr gas as a main etching gas. In this case, Ar or $H_2$ gas may be used as an additional gas for the drying etching. Preferably, the wet etching is accomplished using a KOH, NaOH, or $H_3PO_4$ as an etchant.

In the semiconductor light emitting device fabricating method according to the present invention, the bottom surface of the n-type substrate may be polished by grinding or lapping.

It is preferable that the n-type electrode is formed by at least one material selected from the group consisting of titanium (Ti), aluminium (Al), indium (In), tantalum (Ta), palladium (Pd), cobalt (Co), nickel (Ni), silicon (Si), germanium (Ge), and silver (Ag), and is thermally treated at a temperature of 0–500° C.

The n-type substrate is preferably an n-type Group III–V compound semiconductor substrate, more preferably, an n-type GaN substrate.

According to the present invention, formation of a damaged layer in processing the bottom of the GaN substrate can be prevented so that stable attachment of the n-type on the bottom of the GaN substrate is ensured, thereby improving the properties of a light emitting device formed on the GaN substrate.

BRIEF DESCRIPTION OF THE DRAWINGS

The above object and advantages of the present invention will become more apparent by describing preferred embodiments thereof in detail with reference to the attached drawings in which:

FIGS. 9 and 10 are scanning electron microscopic (SEM) photographs comparatively showing the effects of a conventional method and the method according to the present invention on the surface morphology of the bottom of a GaN substrate, in which FIG. 9 shows a SEM photograph showing the surface morphology after mechanical polishing on the bottom of a GaN substrate according to the conventional fabrication method, and FIG. 10 is a SEM photograph showing the surface morphology after etching the bottom of a GaN substrate according to the method of the present invention;

DETAILED DESCRIPTION OF THE INVENTION

Figure 1:
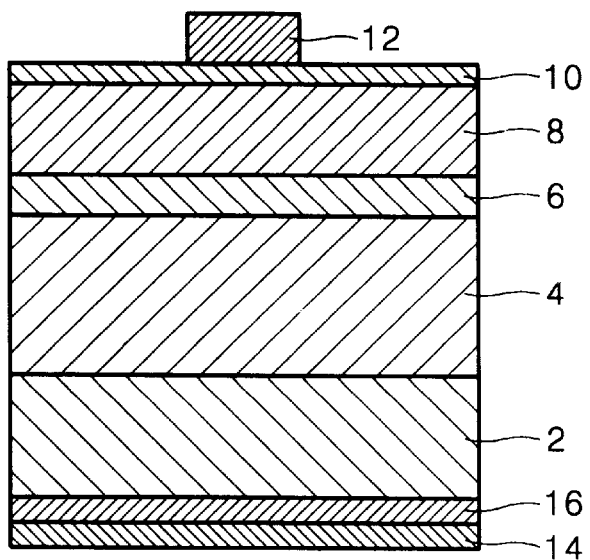
FIG. 1 is a sectional view of a conventional GaN-based light emitting diode (LED)

Preferred embodiments of a method for fabricating a GaN-based semiconductor light emitting device according to the present invention will be described more fully with reference to the accompanying drawings. In the drawings, the thickness of layers and regions are exaggerated for clarity. The same reference numerals as those used in the description of the prior art represent the same elements.

Semiconductor light emitting devices such as light emitting diodes (LEDs) or laser diodes (LDs) slightly differ on their structure but they are fabricated by similar processes as described below. Therefore, a method for fabricating an LD on a GaN substrate now will be described fully, and a method for fabricating a LED will be described briefly based on the LD fabrication method. The following embodiments 1 and 2 are for the fabrication of LDs.

<Embodiment 1>

Figure 3:
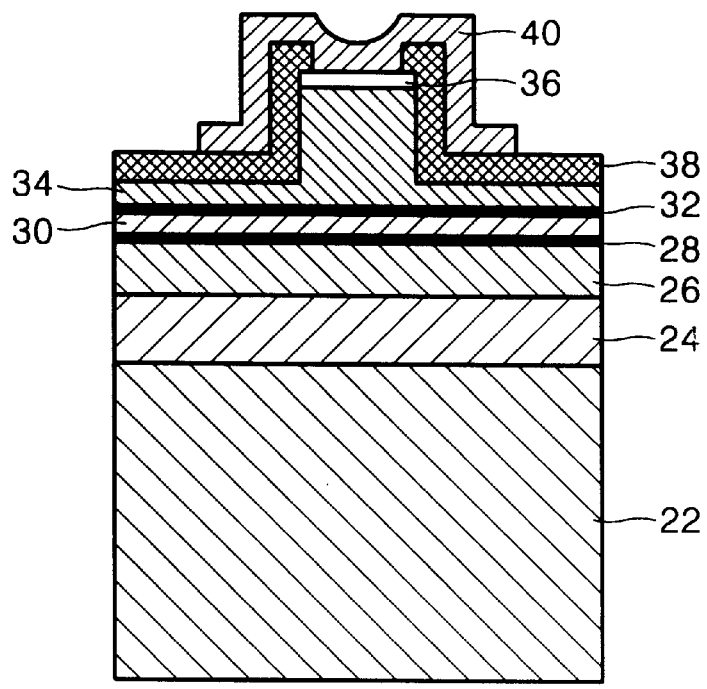
FIGS. 3 through 5 are sectional views illustrating each step of a preferred embodiment of a method for fabricating a GaN-based LD according to the present invention.

Referring to FIG. 3, an n-GaN layer 24, an n-AlGaN/GaN cladding layer 26, an n-GaN waveguide layer 28, an InGaN active layer 30, a p-GaN waveguide layer 32, a p-AlGaN/GaN cladding layer 34, and a p-GaN layer 36 are sequentially formed on an n-GaN substrate 22. The n-AlGaN/GaN cladding layer 26, the n-GaN waveguide layer 28, the InGaN active layer 30, the p-GaN waveguide layer 32, and the p-AlGaN/GaN cladding layer 34 form a cavity resonator layer. Preferably, the p-AlGaN/GaN cladding layer 34 is constructed to have a ridge to be used as a current path.

In particular, a photosensitive pattern (not shown) that defines a region to be the ridge and exposes the remaining region is formed on the p-GaN layer 36. Next, the p-GaN layer 36 and the p-AlGaN/GaN cladding layer 34 are sequentially etched using the photosensitive pattern as an etch mask, and the photoresist pattern is removed. Here, the p-AlGaN/GaN cladding layer 34 is etched to an extent where a region around the ridge of the p-AlGaN/GaN cladding layer remains with a predetermined thickness. As a result, the p-AlGaN/GaN cladding layer 34 having the ridge structure is formed, and the p-GaN layer 36 remains on the ridge.

Next, a passivation layer 38 exposing a region of the p-GaN layer 36 is formed on the p-AlGaN/GaN cladding layer 34. A p-type electrode 40 is formed on the passivation layer 38 in contact with the exposed region of the p-GaN layer 36.

Figure 4:
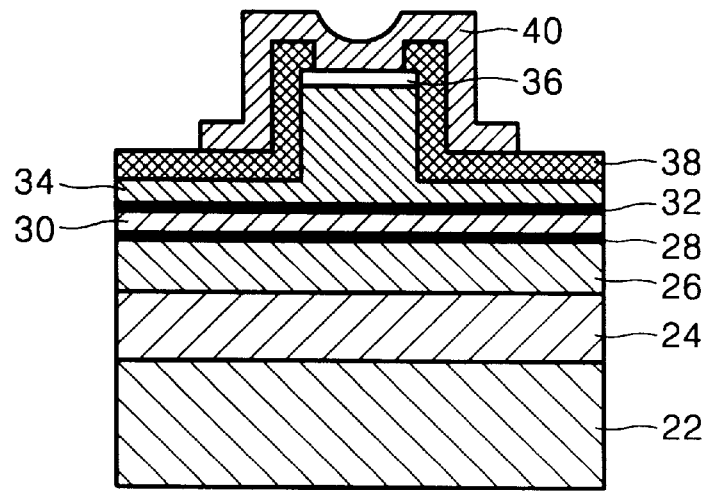

Following this, referring to FIG. 4, the thickness of the GaN substrate 22 is reduced from its bottom surface to an extent where heat generated during operation of the light emitting device formed thereon is effectively dissipated and the light emitting device can still be supported.

The bottom of the GaN substrate 22 is preferably removed by dry or wet etching, alternatively along with mechanical polishing. In particular, the thickness of the GaN substrate 22 is reduced to a predetermined thickness by mechanically polishing its bottom surface and then subjected to a dry or wet etching process.

This process will be described in greater detail in Embodiment 2.

Preferably, the dry etching process is performed by a chemical assisted ion beam etching (CAIBE), electron cyclone resonance (ECR) etching, inductively coupled plasma (ICP) etching, or reactive ion etching (RIE) method. For the CAIBE method, $BCl_3$ is used as a main etching gas and Ar is used as an additional gas. Main gases and additional gases other than the main and additional gases used for the CAIBE method can be used for the other etching methods. For example, $Cl_2$ or HBr gas can be used as a main etching gas with additional $H_2$ gas.

When the wet etching process is applied to etch the bottom of the GaN substrate 22, a predetermined etchant such as KOH, NaOH, or $H_3PO_4$ is preferably used. In particular, the GaN substrate 22 on which a light emitting device construct for an LD is formed is socked in an etch bath containing the predetermined etchant for a predetermined time period until the thickness of the GaN substrate 22 reaches a desired level.

Figure 2:
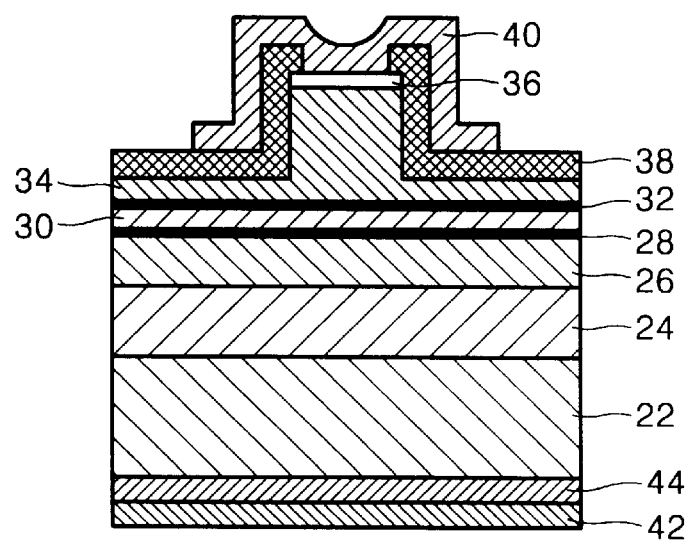
FIG. 2 is a sectional view of a conventional GaN-based laser diode (LD)

Unlike the conventional mechanical polishing method, the dry or wet etching process applied in the present invention does not damage the bottom of the GaN substrate 22 so that the damaged layer 44 (see FIG. 2) is not formed on the bottom of the GaN substrate 22. Therefore, stable attachment of an electrode to the bottom of the GaN substrate 22, which has undergone dry or wet etching, is ensured.

Figure 5:
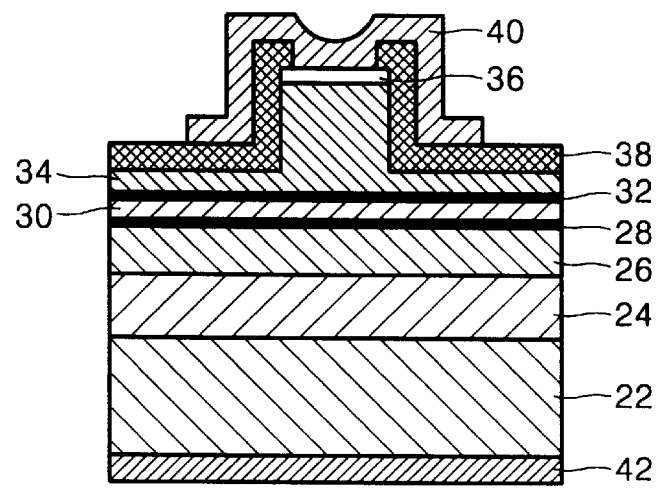

After dry or wet etching on the bottom of the GaN substrate 22, an n-type electrode 42 is formed on the etched bottom surface, as shown in FIG. 5. The n-type electrode is preferably formed of at least one selected from the group consisting of titanium (Ti), aluminium (Al), indium (In), tantalum (Ta), palladium (Pd), cobalt (Co), nickel (Ni), silicon (Si), germanium (Ge), and silver (Ag), but preferably, Ti. The n-type electrode 42 is thermally treated at a temperature of 0–500° C. As a result, the n-type electrode 42 is stably attached on the wet or dry etched bottom surface of the GaN substrate 22.

Therefore, a problem that occurred in the fabrication of a conventional light emitting device in association with the attachment of the n-type electrode to the bottom of the substrate can be solved or reduced at least to an extent where no quality degradation occurs in the resultant LD.

<Embodiment 2>

Figure 6:
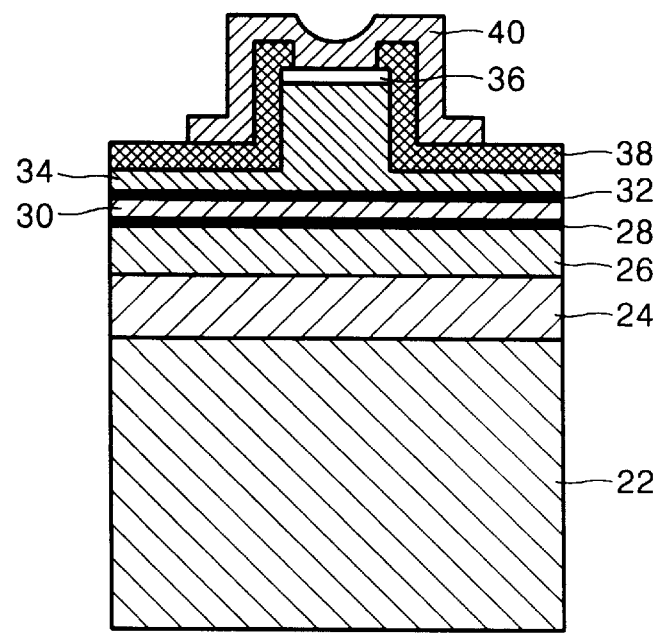
FIGS. 6 through 8 are sectional views illustrating each step of another preferred embodiment of the method for fabricating a GaN-based LD according to the present invention.

Referring to FIG. 6, an n-GaN layer 24, an n-AlGaN/GaN cladding layer 26, an n-GaN waveguide layer 28, an InGaN active layer 30, a p-GaN waveguide layer 32, a p-AlGaN/GaN cladding layer 34, and a p-GaN layer 36 are sequentially formed on an n-GaN substrate 22. According to Embodiment 1, the p-GaN layer 36 and the p-AlGaN/GaN cladding layer 34 are sequentially etched to form a ridge in the p-AlGaN/GaN cladding layer 34, and a passivation layer 38 and a p-type electrode 40 are sequentially formed on the p-AlGaN/GaN cladding layer 34.

Figure 7:
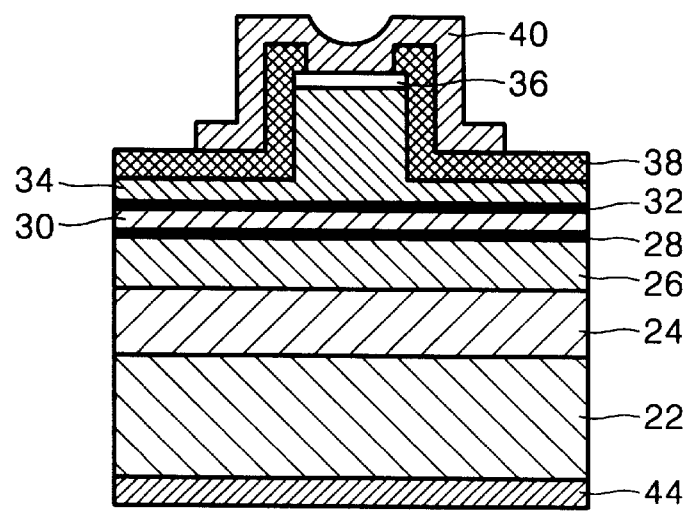

Following this, referring to FIG. 7, the bottom of the GaN substrate 22 is mechanically polished preferably by grinding or lapping. Other advanced polishing techniques are more preferred. Preferably, the thickness of the GaN substrate 22 is reduced as thin as possible to an extent where the light emitting device construct formed thereon can still be supported. A damaged layer 44 is formed on the bottom of the GaN substrate 22 by the mechanical polishing. The damaged layer 44 is removed by dry or wet etching. To fully remove the damage layer 44, preferably dry or wet etching is performed for a period of time longer than an estimated damage removal time. The same gas or etchant as used in Embodiment 1 can be used. By considering that only the damaged layer 44 is etched in the present embodiment, any gas or etchant other than those used in Embodiment 1 can be used.

Figure 8:
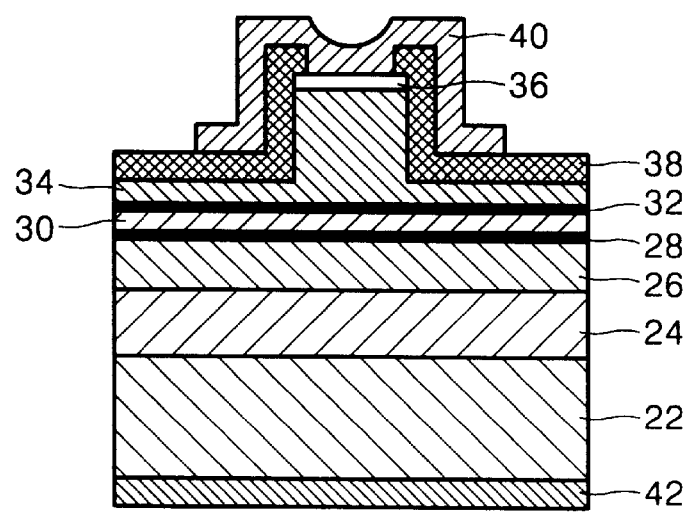

Next, as shown in FIG. 8, according to Embodiment 1, the n-type electrode 42 is formed on the dry- or wet-etched bottom of the GaN substrate 22 and subjected to the following processes.

Figure 9:
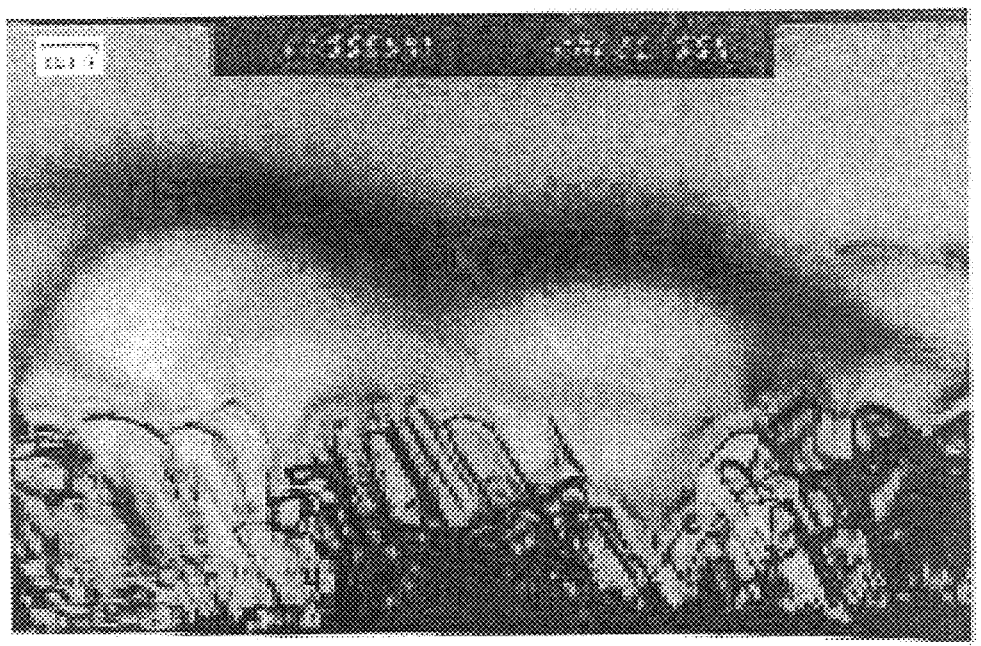

FIG. 9 is a scanning electron microscopic (SEM) photograph showing the surface morphology of the bottom of a GaN substrate mechanically polished by the conventional method. As shown in FIG. 9, a damaged layer with many defects is observed on the bottom of the GaN substrate after mechanical polishing. In FIG. 9, the lower gray portion corresponds to the bottom of the GaN substrate.

Figure 10:
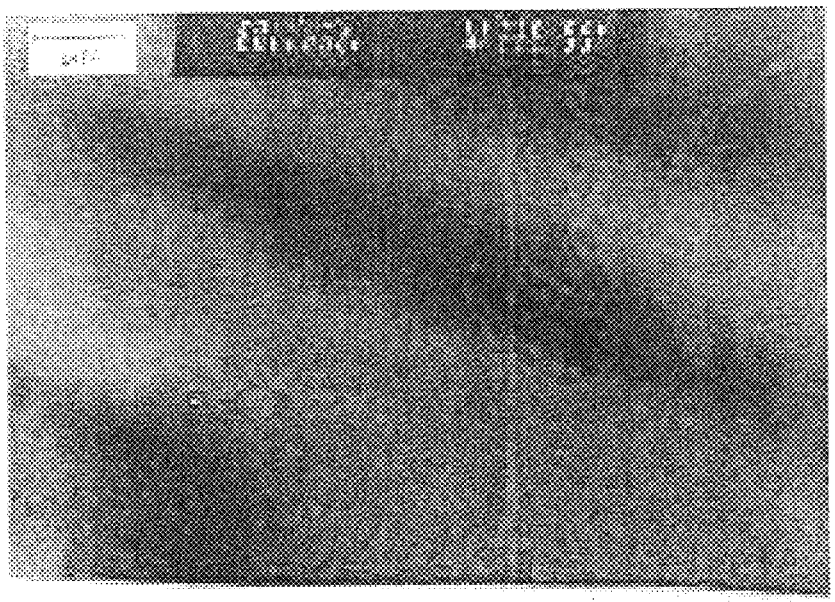

FIG. 10 is a SEM photograph showing the surface morphology of the bottom of a GaN substrate after the damaged layer formed by mechanical polishing is removed by dry or wet etching. As shown in FIG. 10, the bottom of the GaN substrate appears smooth and defect-free without damaged layer thereon.

Figure 11:
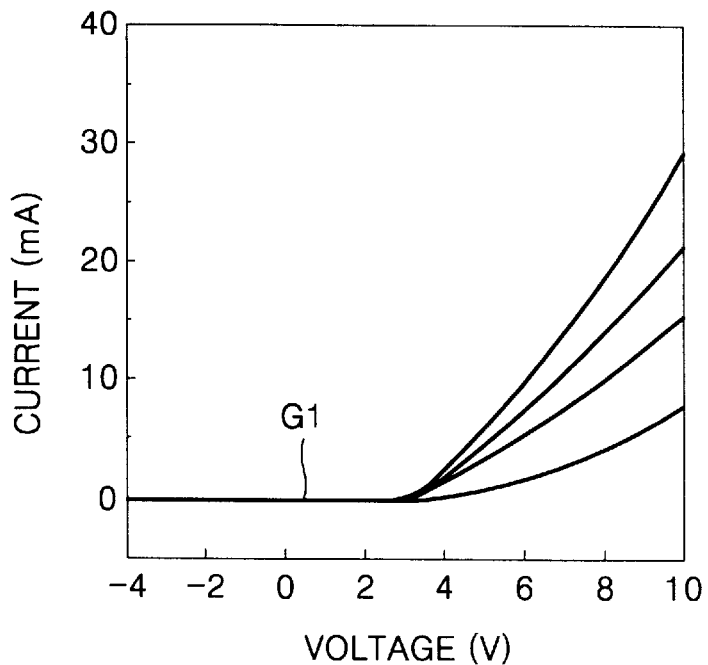
FIG. 11 is a graph showing the current-voltage characteristic of a GaN-based light emitting device fabricated by the conventional method in which an n-type electrode is formed on the mechanically polished bottom of a GaN substrate.
Figure 12:
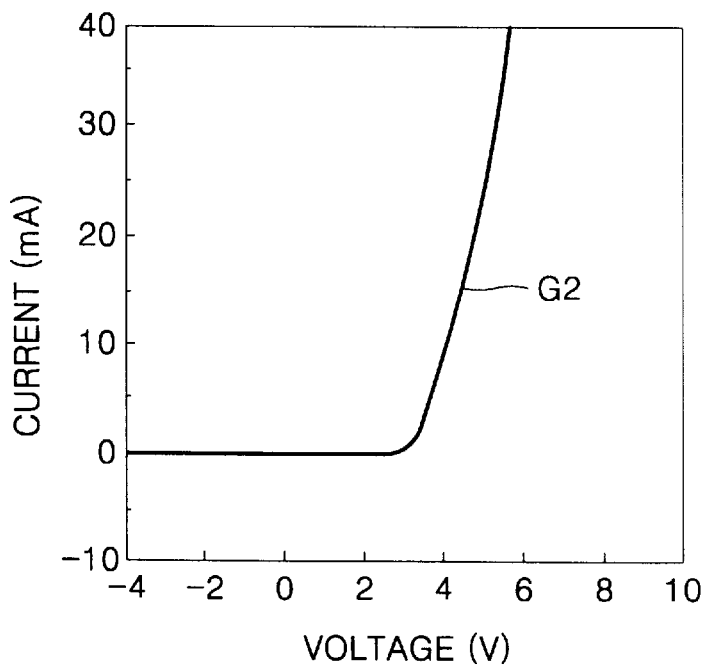
FIG. 12 is a graph showing the current-voltage characteristic of a GaN-based light emitting device fabricated by the method according to the present invention in which an n-type electrode is formed on the dry-etched bottom surface of a GaN substrate.
Figure 13:
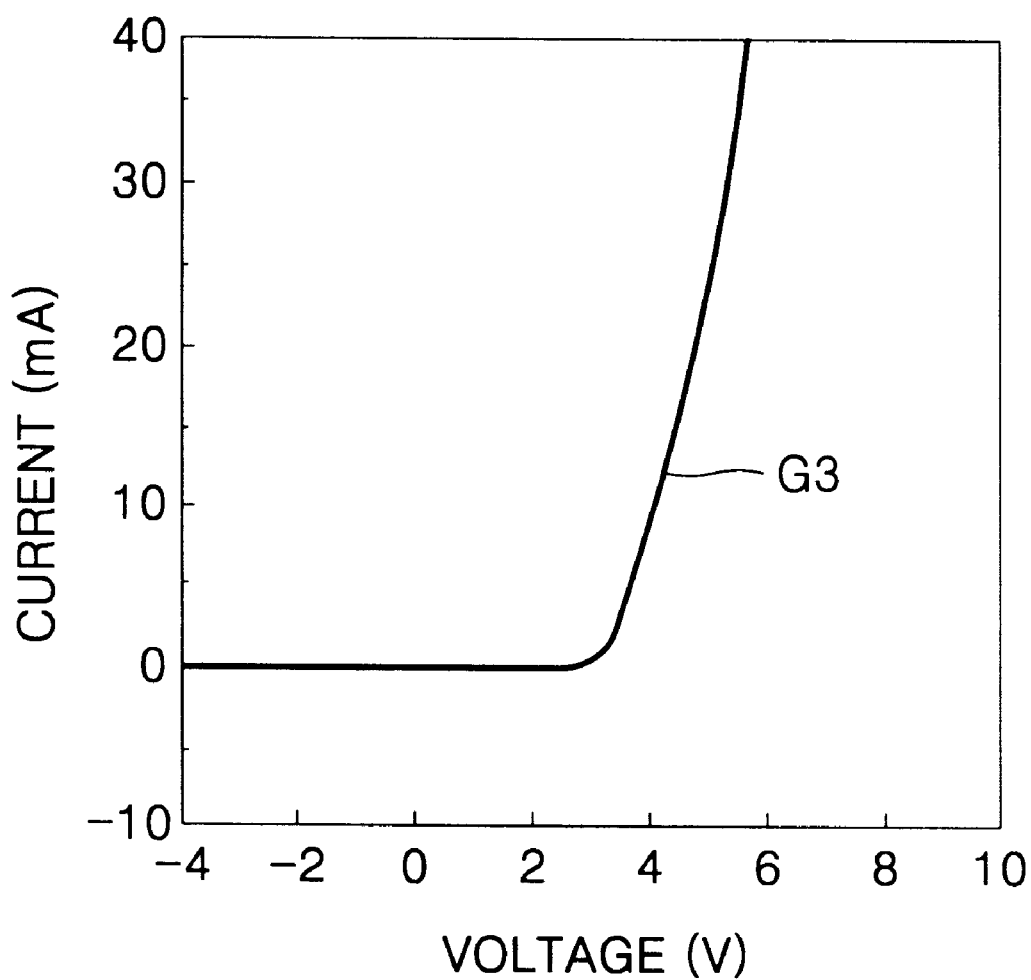
FIG. 13 is a graph showing the current-voltage characteristic of a GaN-based light emitting device fabricated by the method according to the present invention in which an n-type electrode is formed on the wet-etched bottom surface of a GaN substrate.

FIGS. 11, 12, and 13 are graphs illustrating the current-voltage characteristic of light emitting devices fabricated by the conventional method and the methods according to the present invention. Graph G1 of FIG. 11 shows the current-voltage characteristic for a conventional light emitting device formed on a GaN substrate whose bottom surface is mechanically polished prior to the attachment of an n-type electrode. Graph G2 of FIG. 12 shows the current-voltage characteristic for a light emitting device formed on a GaN substrate whose bottom surface is dry etched prior to the attachment of an n-type electrode according to the present invention. Graph G3 of FIG. 13 shows the current-voltage characteristic for a light emitting device formed on a GaN substrate whose bottom surface is wet etched prior to the attachment of an n-type electrode according to the present invention.

In comparison, a current flow of 20 mA is observed at a voltage of 8V or greater for the conventional light emitting device (Graph G1) but at a voltage less than 5V for the light emitting devices fabricated according to the present invention irrespective of the type of etching (Graphs G2 and G3). In addition, no dispersion in voltage-to-current response is observed in the light emitting devices according to the present invention, whereas the conventional light emitting device shows a great dispersion in the voltage-to-current response characteristic.

The method for fabricating a light emitting device according to the present invention described above with reference to LDs can be applied in the fabrication of LEDs. For example, an n-GaN layer, an active layer, and a p-GaN layer are sequentially formed on a GaN substrate. Next, a p-type electrode is formed on the p-GaN layer. After forming a bonding pad in a predetermined region of the p-type electrode, the bottom surface of the GaN substrate having the light emitting construct on the opposite surface is etched by dry or wet etching exclusively, as described above, or along with mechanical polishing. Then, an n-type electrode is formed on the etched bottom surface of the GaN substrate so that a LED is formed.

While this invention has been particularly shown and described with reference to preferred embodiments thereof, the preferred embodiments described above are merely illustrative and are not intended to limit the scope of the invention. For example, it will be appreciated by one skilled in the art that the sprit of the present invention can be applied in the fabrication of non-ridge type LDs or LDs having a variety of types of cavity resonation layer. Compound semiconductor substrates other than the Group III–V GaN substrate described above and Group II–VI compound semiconductor substrates also can be used. Therefore, it will be understood by those skilled in the art that the spirit and scope of the invention is defined by the appended claims, not by the preferred embodiments described above.

As described above, in the method for fabricating a GaN-based light emitting device, and particularly, a LD, according to the present invention, the bottom surface of the GaN substrate having a light emitting construct on the opposite surface is dry or wet etched exclusively or following mechanical etching to remove a damaged layer formed by the mechanical etching. Next, an n-type electrode is formed on the etched bottom surface of the GaN substrate without the damaged layer interposed therebetween. As a result, stable attachment of the n-type electrode to the bottom of the GaN substrate is ensured with improved properties of LDs or LEDs, and particularly, high light-emitting efficiency.

What is claimed is:

1. A method for fabricating a semiconductor light emitting device, the method comprising:

forming a light emitting construct including a p-type electrode on an n-type substrate;

etching a bottom surface opposite to a surface of the n-type substrate on which said light emitting construct is formed to form a uniformly flat surface opposite to said light emitting construct; and forming an n-type electrode on the uniformly flat surface opposite to said light emitting construct of the n-type substrate.

2. The method of claim 1, wherein, after forming the light emitting construct and before etching the bottom surface of the n-type substrate, the bottom surface of the n-type substrate is mechanically polished.

3. The method of claim 2, wherein the light emitting construct is for a light emitting diode (LED).

4. The method of claim 2, wherein the light emitting construct is for a laser diode (LD).

5. The method of claim 1, wherein the bottom surface of the n-type substrate is dry etched.

6. The method of claim 1, wherein the bottom surface of the n-type substrate is wet etched.

7. The method of claim 5, wherein the dry etching is accomplished by a method selected from the group consisting of chemical assisted ion beam etching (CAIBE), electron cyclone resonance (ECR) etching, inductively coupled plasma (ICP) etching, and reactive ion etching (RIE).

8. The method of claim 7, wherein, in the dry etching, $Cl_2$, $BCl_3$ or HBr gas is used as a main etching gas.

9. The method of claim 8, wherein, in the dry etching, Ar or $H_2$ gas is used as an additional gas.

10. The method of claim 6, wherein the wet etching is accomplished using a KOH, NaOH, or $H_3PO_4$ as an etchant.

11. The method of claim 2, wherein the bottom surface of the n-type substrate is polished by grinding or lapping.

12. The method of claim 1, wherein the n-type electrode is thermally treated at a temperature of 0–500° C.

13. The method of claim 1, wherein the n-type electrode is formed by at least one material selected from the group consisting of titanium (Ti), aluminum (Al), indium (In), tantalum (Ta), palladium (Pd), cobalt (Co), nickel (Ni), silicon (Si), germanium (Ge), and silver (Ag).

14. The method of claim 1, wherein the n-type substrate is an n-type Group III–V compound semiconductor substrate.

15. The method of claim 14, wherein the n-type Group III–V compound semiconductor substrate is an n-type GaN substrate.

16. The method of claim 12, wherein the n-type electrode is formed by at least one material selected from the group consisting of titanium (Ti), aluminum (Al), indium (In), tantalum (Ta), palladium (Pd), cobalt (Co), nickel (Ni), silicon (Si), germanium (Ge), and silver (Ag).

* * * * *